United States Patent
Tsai

(10) Patent No.: US 9,431,280 B2
(45) Date of Patent: Aug. 30, 2016

(54) SELF-LOCKABLE OPENING AND CLOSING MECHANISM FOR VACUUM CABIN DOOR

(71) Applicant: KING LAI HYGIENIC MATERIALS CO., LTD, Hsinchu County (TW)

(72) Inventor: Huan-Yu Tsai, Hsinchu County (TW)

(73) Assignee: KING LAI HYGIENIC MATERIALS CO., LTD, Hsinchu County (TW)

( * ) Notice: Subject to any disclaimer, the term of this patent is extended or adjusted under 35 U.S.C. 154(b) by 394 days.

(21) Appl. No.: 14/097,025

(22) Filed: Dec. 4, 2013

(65) Prior Publication Data

US 2015/0152672 A1    Jun. 4, 2015

(51) Int. Cl.
*E05F 11/00*    (2006.01)
*H01L 21/67*    (2006.01)

(52) U.S. Cl.
CPC ...... *H01L 21/67126* (2013.01); *E05Y 2800/12* (2013.01); *E05Y 2900/60* (2013.01); *Y10T 292/1078* (2015.04)

(58) Field of Classification Search
CPC .................... H01L 21/67126; E05Y 2800/12; Y10T 292/1078
USPC .................................................. 49/324, 363
See application file for complete search history.

(56) References Cited

U.S. PATENT DOCUMENTS

| | | | | |
|---|---|---|---|---|
| 3,321,174 A | * | 5/1967 | Schertler | 251/65 |
| 3,352,535 A | * | 11/1967 | Power | 251/204 |
| 3,397,862 A | * | 8/1968 | Batzer et al. | 251/204 |
| 4,027,707 A | * | 6/1977 | Maskell | 141/66 |
| 4,470,576 A | * | 9/1984 | Schertler | 251/158 |
| 5,177,900 A | * | 1/1993 | Solowiej | 49/363 |
| 5,188,145 A | * | 2/1993 | Mathieu | 137/340 |
| 6,214,292 B1 | * | 4/2001 | Las Navas Garcia | 422/63 |
| 8,215,612 B2 | * | 7/2012 | Ehrne | 251/204 |
| 2006/0266417 A1 | * | 11/2006 | Wu | 137/269 |
| 2007/0175393 A1 | * | 8/2007 | Nishimura et al. | 118/715 |
| 2008/0305632 A1 | * | 12/2008 | Nishimura et al. | 438/680 |
| 2012/0217136 A1 | * | 8/2012 | Ouellette et al. | 198/689.1 |
| 2012/0252327 A1 | * | 10/2012 | Kobayashi et al. | 451/398 |
| 2015/0157030 A1 | * | 6/2015 | Giger et al. | |

FOREIGN PATENT DOCUMENTS

GB    2160898 A  *  1/1986  ............. C23C 14/34

* cited by examiner

*Primary Examiner* — Jerry Redman
(74) *Attorney, Agent, or Firm* — WPAT, P.C., Intellectual Property Attorneys; Anthony King

(57) ABSTRACT

A self-lockable opening and closing mechanism includes a frame, a vacuum cabin door, a driving cylinder mounted in the frame, and a linkage mechanism formed of a horizontal lever, one or a pair of first bars, one or a pair of rotational levers, one or a pair of adjustment blocks, one or a pair of second bars, one or a pair of sliding blocks and one or a pair of valve rods and coupled between the driving cylinder and the linkage mechanism in such a manner that operating the driving cylinder drives the valve rods to move the vacuum cabin door between an open position and a close position, and a locking force is automatically produced to hold the vacuum cabin door in the close position against any reaction force, preventing the problem of failure or reduced effect in vacuum sealing.

10 Claims, 7 Drawing Sheets

SELF-LOCKABLE OPENING AND CLOSING MECHANISM FOR VACUUM CABIN DOOR

BACKGROUND OF THE INVENTION

1. Field of the Invention

The present invention relates to vacuum cabin door technology, and more particularly to a self-lockable opening and closing mechanism for vacuum cabin door, which automatically produces a locking force to lock the vacuum cabin door in position when the vacuum cabin door is closed.

2. Description of the Related Art

In semiconductor industry involving wafer fabrication or TFT LCD production, glass substrates are normally processed in a vacuum environment, for example, in a vacuum cabin. A vacuum cabin generally comprises a vacuum cabin door drivable by an opening and closing mechanism between an open position and a close position. When the vacuum cabin door is opened, the workpiece can be moved over the vacuum cabin door into the inside of the vacuum cabin. After the workpiece is delivered into the inside of the vacuum cabin, the vacuum cabin door is closed, and then a pumping operation is performed to draw air out of the vacuum cabin.

An opening and closing mechanism for vacuum cabin is known using a pneumatic cylinder or hydraulic cylinder to move the vacuum cabin door between the open position and the close position either directly or through a rack and gear mechanism. However, when the vacuum cabin door is moved to the close position, the pneumatic or hydraulic cylinder must keep giving pressure to the vacuum cabin door panel against the cabin door frame, keeping the vacuum cabin door in the close position. However, after a long use of the machine, a wear problem may occur, and the pneumatic or hydraulic pressure of the pneumatic or hydraulic cylinder may become insufficient due to pipeline problems, resulting in sealing failure between the vacuum cabin door and the vacuum cabin.

Taiwan Patent TW430012 discloses a vacuum cabin door opening and closing mechanism, which comprises a frame, a first pneumatic cylinder affixed to the frame, a second pneumatic cylinder affixed to the first pneumatic cylinder and movable up and down relative to the first pneumatic cylinder, a vacuum cabin door, and a linkage coupled between the vacuum cabin door and the second pneumatic cylinder. During operation, the first pneumatic cylinder is driven to move the second pneumatic cylinder and the vacuum cabin door upwardly into alignment with the vacuum cabin, and then the second pneumatic cylinder is retracted, driving the linkage to move the vacuum cabin door horizontally toward the vacuum cabin, and thus the vacuum cabin is closed by the vacuum cabin door. According to this design, it is necessary to move the vacuum cabin door vertically and horizontally through two actions, prolonging the operation time and increasing the structural dimension and cost.

Further, CN 101787834 B discloses an opening and closing device for horizontal vacuum cabin, which has multiple auto locking mechanisms mounted at the outside wall around the opening of the vacuum cabin for locking the vacuum cabin door to the vacuum cabin in the close position. However, this design is not a perfect solution because the opening and closing device and the auto locking mechanism must be separately driven and controlled.

SUMMARY OF THE INVENTION

The present invention has been accomplished under the circumstances in view. It is the main object of the present invention to provide a self-lockable opening and closing mechanism for vacuum cabin door, which uses a driving cylinder to move a linkage mechanism in moving the vacuum cabin door between an open position and a close position, and automatically produces a locking force to hold the vacuum cabin door in the close position against any reaction force, preventing the problem of failure or reduced effect in vacuum sealing due to insufficient power.

To achieve this and other objects of the present invention, a self-lockable opening and closing mechanism of the present invention comprises a frame that is a hollow frame formed of a base portion, two side panels and a top panel, a driving cylinder mounted at the base portion within the frame and comprising a reciprocatable driving shaft, a horizontal lever fixedly connected to the driving shaft, at least one first bar each having one end thereof pivotally connected to the horizontal lever, at least one rotational lever each comprising a first pivot hole, a second pivot hole and a third pivot hole respectively located at three corners of a triangular profile thereof, the first pivot hole of each rotational lever being pivotally connected to an opposite end of one respective first bar, at least one adjustment block respectively pivotally connected to the second pivot hole of one respective rotational lever, at least one second bar each having one end thereof pivotally connected to the third pivot hole of one respective rotational lever, at least one sliding block respectively slidably mounted at one respective side panel within the frame and respectively pivotally connected to an opposite end of one respective second bar, a vacuum cabin door, and at least one valve rod each having one end thereof connected to one respective sliding block and an opposite end thereof connected to the vacuum cabin door for moving the vacuum cabin door between an open position and a close position.

Further, when the driving cylinder drives the vacuum cabin door to the close position, the imaginary axis extending through the second pivot hole and third pivot hole of each rotational lever and the axis of the respective second bar define a contained angle θ within the range of 170°~190°. Preferably, the imaginary axis extending through the second pivot hole and third pivot hole of each rotational lever and the axis of the respective second bar are kept in axial alignment and in a parallel relationship with the axis of the driving cylinder when the driving cylinder drives the vacuum cabin door to the close position. Thus, if the door panel of the vacuum cabin door is forced by a reaction force or any other factor to move in the reverse direction at this time, the reaction force will be linearly transferred through the at least one valve rod, the at least one sliding block, the at least one second bar, the at least one rotational lever and the at least one adjustment block to the top panel of the frame, preventing the component parts and the vacuum cabin door from working and assuring positive locking of the vacuum cabin door. Thus, the invention does not need an extra power to keep the driving cylinder in the locking position.

Preferably, the self-lockable opening and closing mechanism further comprises a sliding guide means, for example, linear guideway located at each side panel and extending in a parallel manner relative to the axis of the driving shaft for guiding sliding movement of one respective sliding block along one respective side panel of the frame, enhancing sliding smoothness and displacement precision.

Preferably, the self-lockable opening and closing mechanism further comprises at least one adjustment screw rotatably mounted in the top panel of the frame and respectively threaded into one respective adjustment block in a parallel manner relative to the axis of the driving shaft and rotatable to adjust the distance between one respective adjustment block and the top panel of the frame.

BRIEF DESCRIPTION OF THE DRAWINGS

Other and further advantages and features of the present invention will be understood by reference to the description of the preferred embodiment in conjunction with the accompanying drawings where the components are illustrated based on a proportion for explanation but not subject to the actual component proportion.

DETAILED DESCRIPTION OF THE INVENTION

Figure 1:
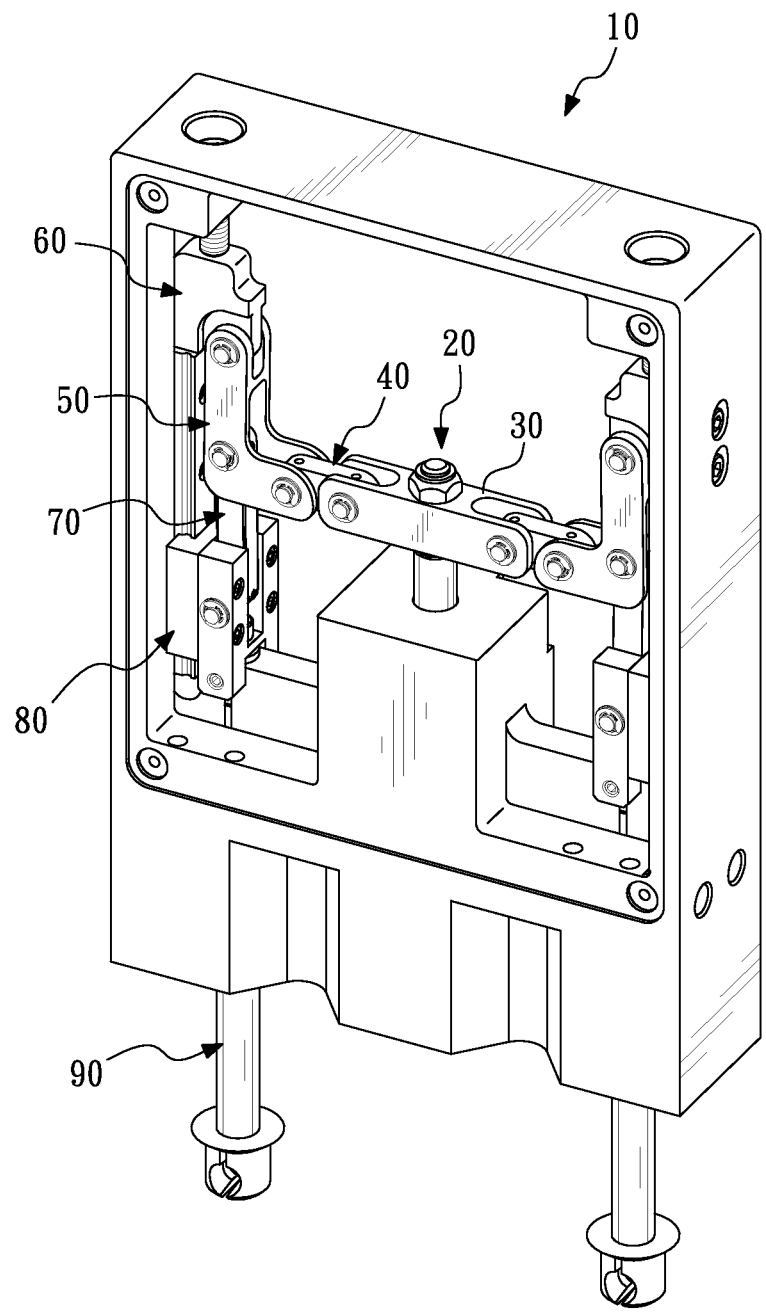
FIG. 1 is a perspective view of a self-lockable opening and closing mechanism for vacuum cabin door in accordance with the present invention.
Figure 2:
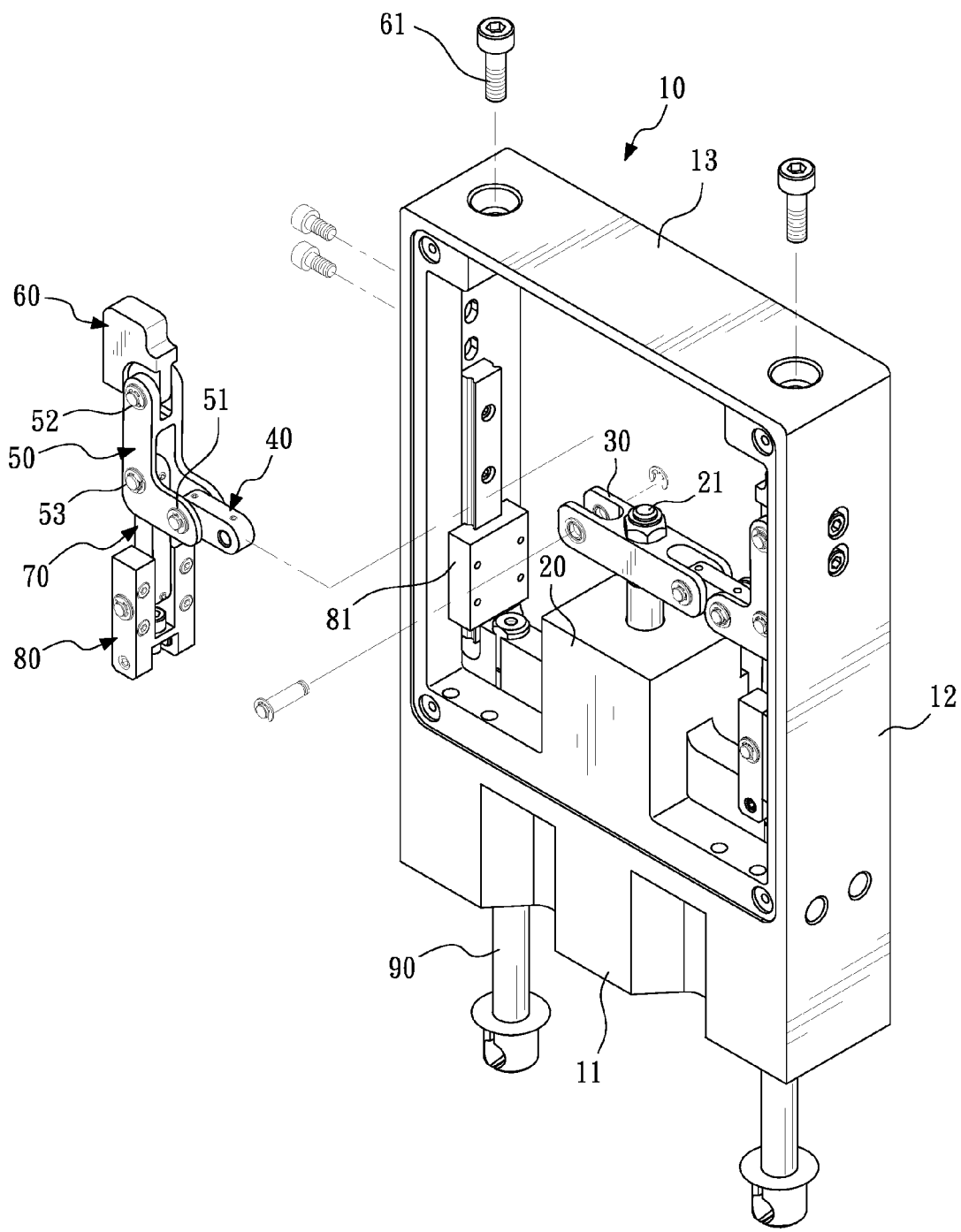
FIG. 2 is an exploded view of the self-lockable opening and closing mechanism for vacuum cabin door in accordance with the present invention.
Figure 3:
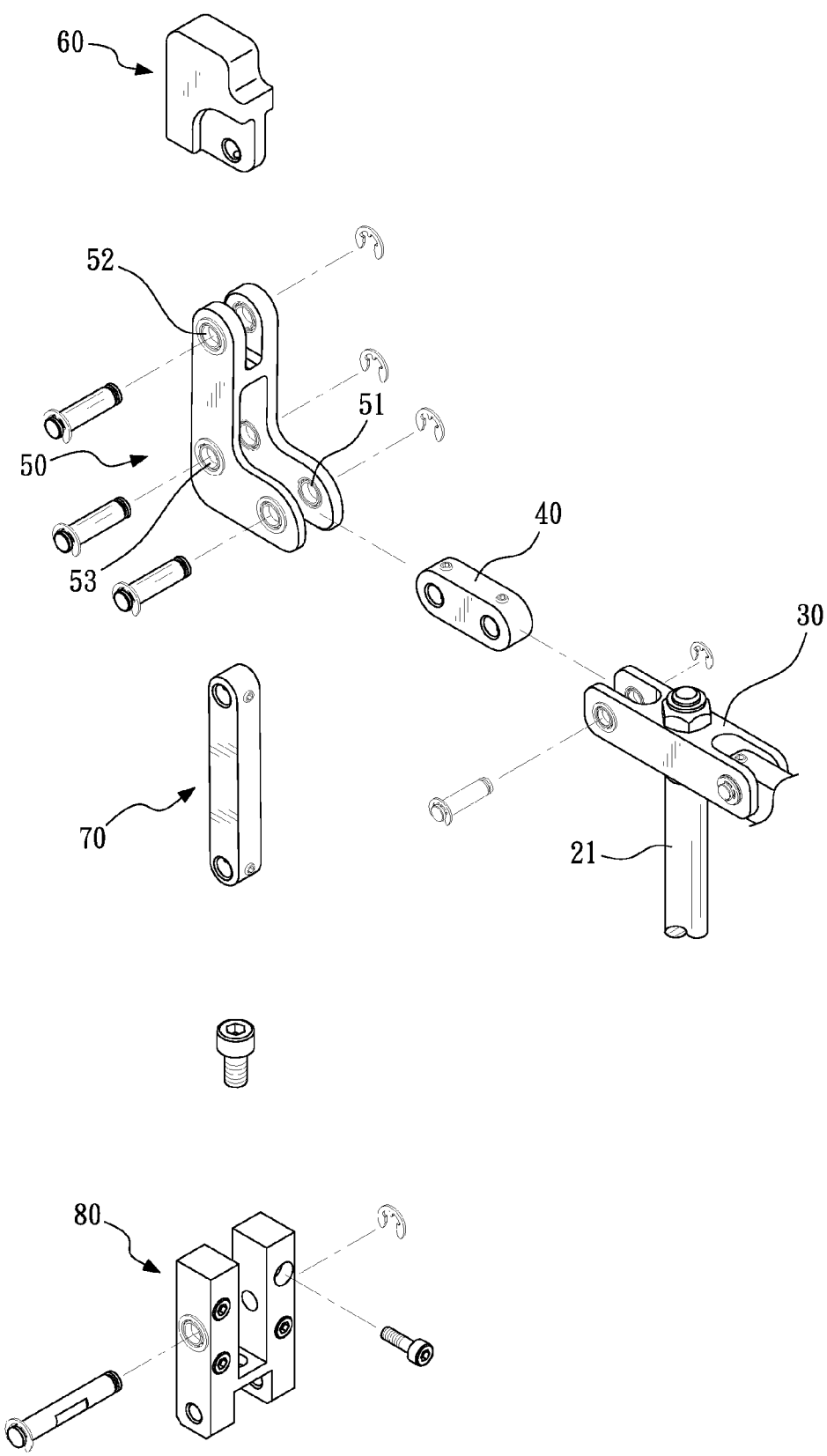
FIG. 3 is an exploded view of the linkage mechanism of the self-lockable opening and closing mechanism for vacuum cabin door in accordance with the present invention.

Referring to FIGS. 1-4, a self-lockable opening and closing mechanism for vacuum cabin door in accordance with the present invention is shown. As illustrated, the self-lockable opening and closing mechanism for vacuum cabin door comprises:

a frame 10 being a hollow member comprising a base portion 11, two side panels 12 respectively perpendicularly connected to two opposite ends of the base portion 11 in parallel and a top panel 13 connected between respective distal ends of the two side panels 12 opposite to the base portion 11;

a driving cylinder 20 prepared in the form of a pneumatic or hydraulic cylinder and mounted at the base portion 11 within the frame 10 and adapted to reciprocate a vertically extending driving shaft 21 thereof between a received position in the base portion 11 and an extended position toward the top panel 13;

a horizontal lever 30 connected to the distal end of the driving shaft 21 at right angles;

at least one, for example, two first bars 40 each having one end thereof pivotally connected to one end of the horizontal lever 30;

at least one, for example, two rotational levers 50 each comprising a first pivot hole 51, a second pivot hole 52 and a third pivot hole 53 respectively disposed at three corners of a triangular profile thereof and having the first pivot hole 51 thereof pivotally connected to an opposite end of one respective first bar 40;

at least one, for example, two adjustment blocks 60 respectively pivotally connected to the second pivot holes 52 of the two rotational levers 50;

at least one, for example, two adjustment screws 61 rotatably mounted in the top panel 13 and respectively threaded into the two adjustment blocks 60 in a parallel manner relative to the axis of the driving shaft 21 and rotatable to adjust the distance between the respective adjustment block 60 and the top panel 13;

at least one, for example, two second bars 70 each having one end thereof pivotally connected to the third pivot hole 53 of one respective rotational lever 50;

at least one, for example, two sliding blocks 80 respectively slidably mounted one respective sliding guide means, for example, linear guideway 81 at each of the side panels 12 within the frame 10 in a parallel manner relative to axis of the driving shaft 21 and respectively pivotally connected to respective opposite ends of the second bars 70; and at least one, for example, two valve rods 90 each having one end thereof connected to one respective sliding block 80 and an opposite end thereof connected to a vacuum cabin door 100 for moving the vacuum cabin door 100 between an open position and a close position.

The aforesaid horizontal lever 30, first bars 40, rotational levers 50, adjustment blocks 60, second bars 70, sliding blocks 80 and valve rods 90 form a linkage mechanism that is drivable by the driving shaft 21 of the driving cylinder 20 to move the vacuum cabin door 100 between the open position and the close position.

Further, the vacuum cabin door 100 comprises a door frame 101 and a door panel 102. The door frame 101 is connected to one side of the base portion 11 of the frame 10 opposite to the driving cylinder 20, defining therein a sliding groove 103 in parallel to the axis of the driving shaft 21 and an opening 104 cut through the sliding groove 103. The valve rods 90 are inserted through the base portion 11 and connected to the door panel 102 so that the door panel 102 is movable by the valve rods 90 between the close position to seal the opening 104 and the open position to open the opening 104.

When the rotational levers 50 and the second bars 70 are in the close position, the imaginary axis A extending through the second pivot hole 52 and third pivot hole 53 of each rotational lever 50 defines with the axis B of the respective second bar 70 a contained angle θ within the range of 170°~190°. Preferably, when the rotational levers 50 and the second bars 70 are in the close position, the imaginary axis A extending through the second pivot hole 52 and third pivot hole 53 of each rotational lever 50 is in axial alignment with the axis B of the respective second bar 70 and in parallel to the axis of the driving cylinder 20.

In the present preferred embodiment, one pair of first bars 40, one pair of rotational levers 50, one pair of adjustment blocks 60, one pair of second bars 70, one pair of sliding blocks 80 and one pair of valve rods 90 are provided and bilaterally arranged in a symmetric manner relative to the axis of the driving cylinder 20.

Figure 4:
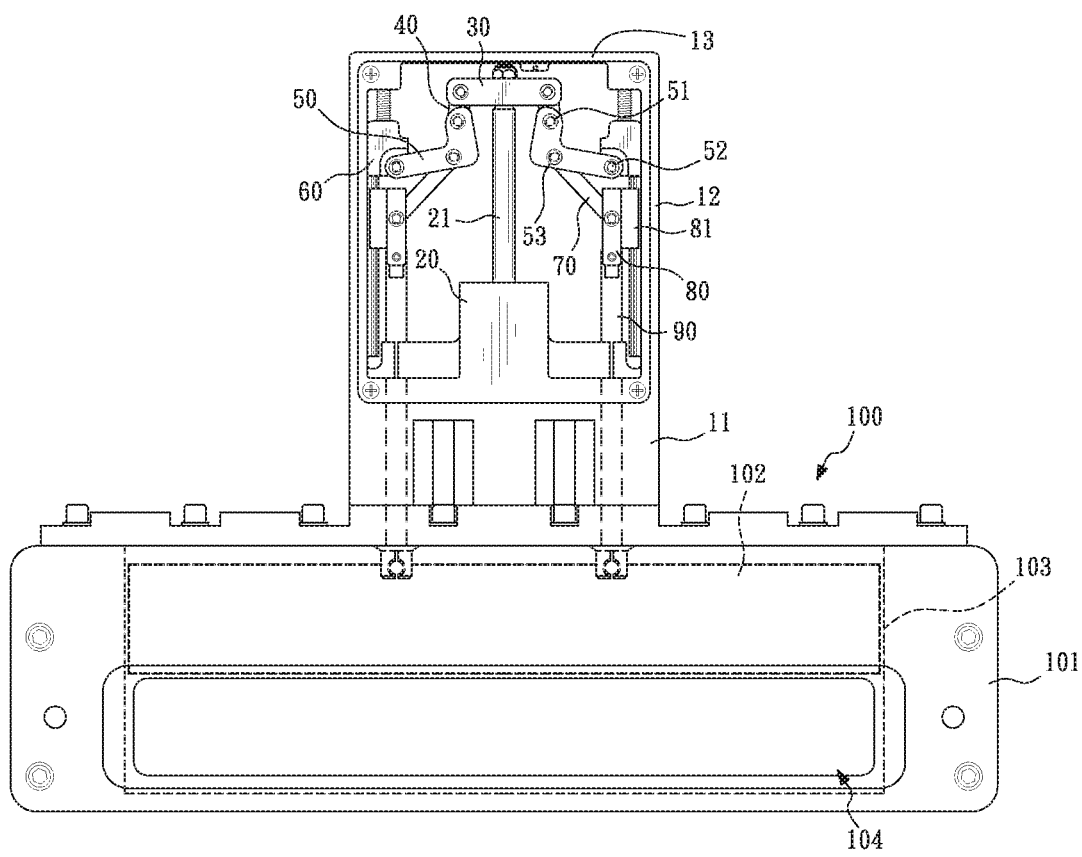
FIG. 4 is a schematic plain view of the present invention illustrating the self-lockable opening and closing mechanism in the open position.
Figure 5:
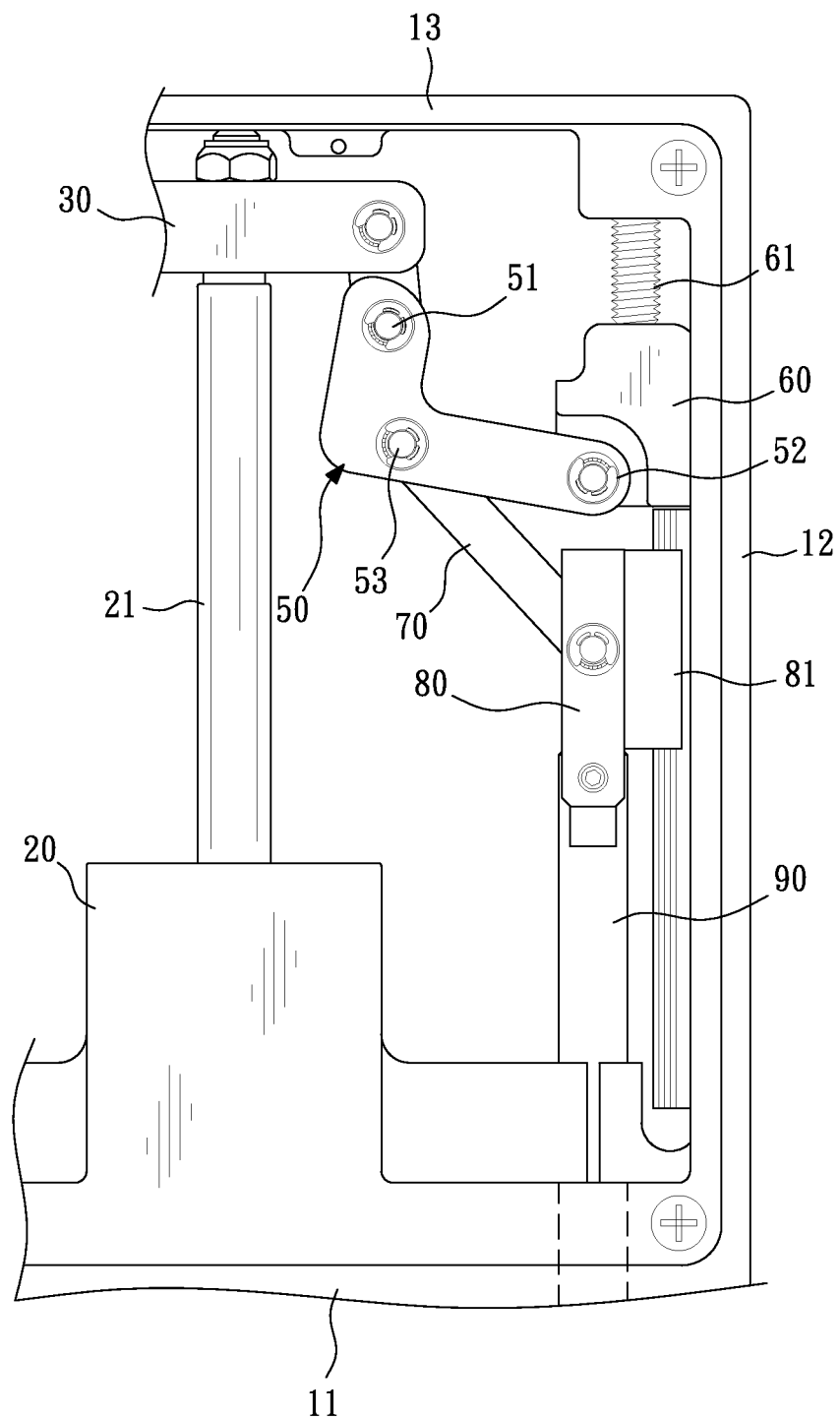
FIG. 5 is an enlarged view of a part of FIG. 4.

After understanding the structural details of the self-lockable opening and closing mechanism for vacuum cabin door in accordance with the present invention, the operational principle of the present invention is outlined hereinafter:

As shown in FIG. 4 and FIG. 5, when going to move the vacuum cabin door 100 to the open position, the driving shaft 21 of the driving cylinder 20 is extended out toward the top panel 13, and the valve rods 90 moves the door panel 102 along the sliding grooves 103 toward the base portion 11 via the linking action of the horizontal lever 30, first bars 40, rotational levers 50, adjustment blocks 60, second bars 70 and sliding blocks 80, thereby moving the door panel 102 to open the opening 104.

Figure 6:
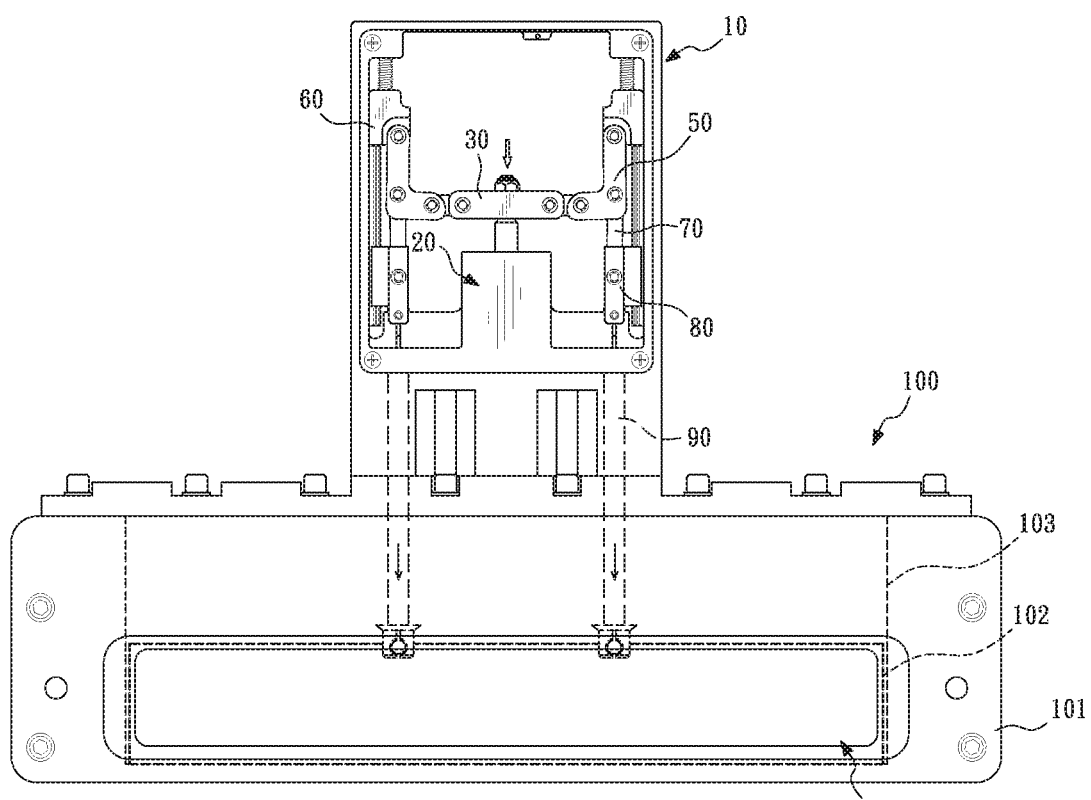
FIG. 6 is a schematic plain view of the present invention illustrating the self-lockable opening and closing mechanism in the close position.
Figure 7:
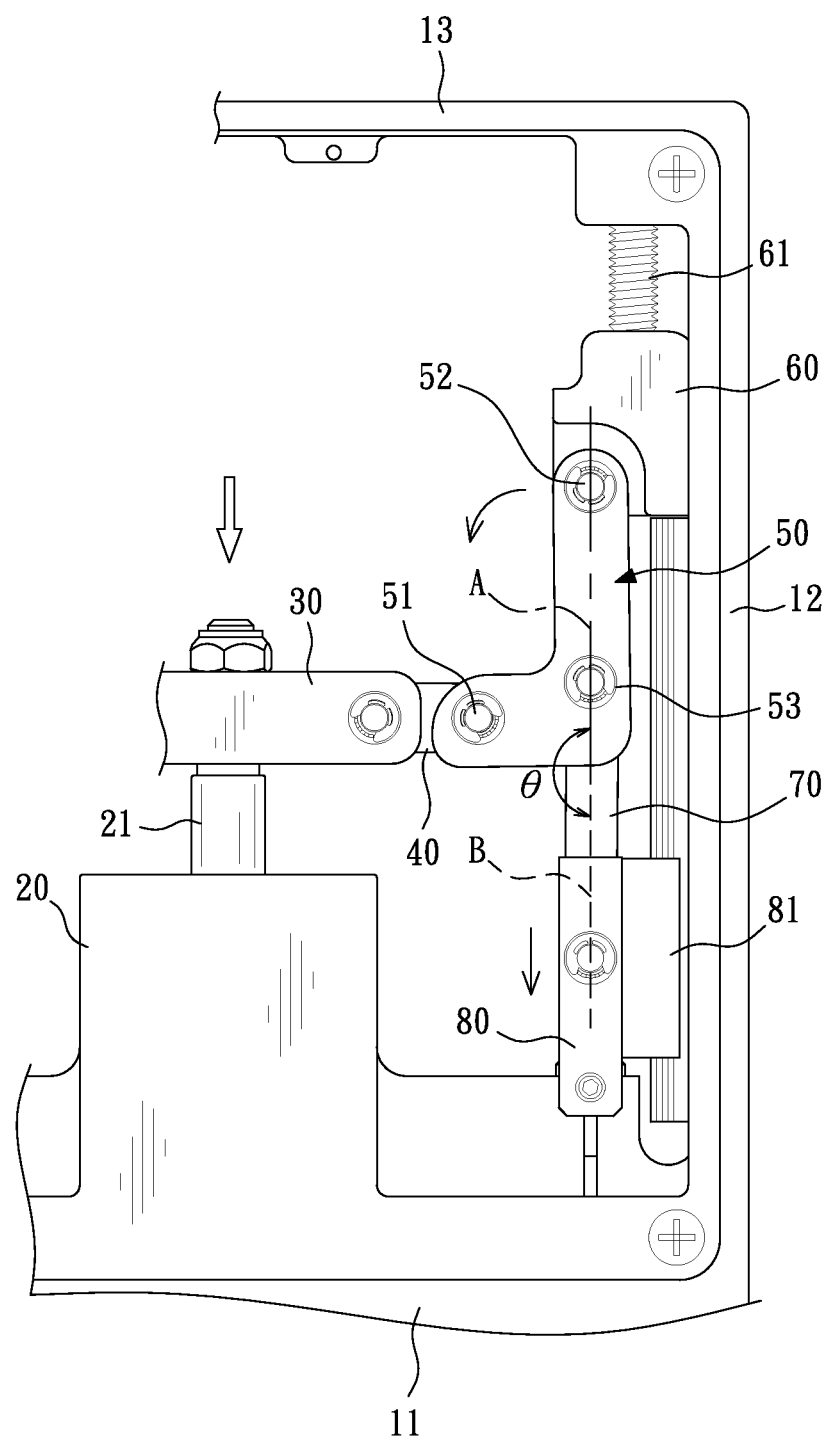
FIG. 7 is an enlarged view of a part of FIG. 6.

On the contrary, as shown in FIG. 6 and FIG. 7, when going to move the vacuum cabin door 100 to the close position, the driving shaft 21 of the driving cylinder 20 is retracted toward the inside of the base portion 11 to move the horizontal lever 30 and the first bars 40. At this time, the first pivot hole 51 of each rotational lever 50 is driven by the respective first bar 40, causing the respective rotational lever 50 to turn about the axis of the pivot point between the second pivot hole 52 of the respective rotational lever 50 and the associating adjustment block 60 and to further force the associating second bar 70 and the associating sliding block 80 along the respective sliding guide means 81 toward the base portion 11. When each sliding block 80 is being moved toward the base portion 11, the valve rods 90 are forced by the sliding blocks 80 toward the door frame 101, thereby carrying the door panel 102 to seal the opening 104.

When the driving cylinder 20 is driven to close the vacuum cabin door 100, the contained angle θ defined between the imaginary axis A that extends through the second pivot hole 52 and third pivot hole 53 of each rotational lever 50 and the axis B of the respective second bar 70 is within the range of 170°~190°. Further, when the rotational levers 50 and the second bars 70 are in the close position, the imaginary axis A extending through the second pivot hole 52 and third pivot hole 53 of each rotational lever 50 is in axial alignment with the axis B of the respective second bar 70 and in parallel to the axis of the driving cylinder 20. Thus, if the door panel 102 of the vacuum cabin door 100 is forced by a reaction force or any other factor to move in the reverse direction at this time, the reaction force will be linearly transferred through the valve rods 90, the sliding blocks 80, the second bars 70, the rotational levers 50 and the adjustment blocks 60 to the top panel 13 of the frame 10, preventing the component parts and the vacuum cabin door 100 from working and assuring positive locking of the vacuum cabin door 100. Thus, the invention does not need an extra power to keep the driving cylinder 20 in the locking position. Even the driving cylinder 20 or the related piping leaks or lacks in strength, the vacuum cabin door 100 will neither become loose nor break the vacuum effect of the vacuum cabin.

Although one particular embodiment of the invention has been described in detail for purposes of illustration, various modifications and enhancements may be made without departing from the spirit and scope of the invention. Accordingly, the invention is not to be limited except as by the appended claims.

What is claimed is:

1. A self-lockable opening and closing mechanism, comprising:
    a frame being a hollow frame formed of a base portion, two side panels and a top panel;
    a driving cylinder mounted at said base portion within said frame, said driving cylinder comprising a reciprocatable driving shaft;
    a horizontal lever fixedly connected to said driving shaft;
    at least one first bar each having one end thereof pivotally connected to said horizontal lever;
    at least one rotational lever each comprising a first pivot hole, a second pivot hole and a third pivot hole respectively located at three corners of a triangular profile thereof, the first pivot hole of each said rotational lever being pivotally connected to an opposite end of one respective said first bar;
    at least one adjustment block respectively pivotally connected to the second pivot hole of one respective said rotational lever;
    at least one second bar each having one end thereof pivotally connected to the third pivot hole of one respective said rotational lever;
    at least one sliding block respectively slidably mounted at one respective said side panel within said frame and respectively pivotally connected to an opposite end of one respective said second bar;
    a vacuum cabin door; and
    at least one valve rod each having one end thereof connected to one respective said sliding block and an opposite end thereof connected to said vacuum cabin door for moving said vacuum cabin door between an open position and a close position.

2. The self-lockable opening and closing mechanism as claimed in claim 1, wherein said two side panels of said frame are respectively perpendicularly connected to two opposite ends of said base portion in parallel; said top panel of said frame is connected between respective distal ends of said two side panels opposite to said base portion.

3. The self-lockable opening and closing mechanism as claimed in claim 2, wherein said driving shaft of said driving cylinder is movable between a received position in said base portion and an extended position toward said top panel.

4. The self-lockable opening and closing mechanism as claimed in claim 1, wherein when said at least one rotational lever and said at least one second bar are in said close position, a straight line extending through the second pivot hole and third pivot hole of each said rotational lever and an axis of the respective said second bar define a contained angle within the range of 170-190 degrees.

5. The self-lockable opening and closing mechanism as claimed in claim 1, wherein when said at least one rotational lever and said at least one second bar are in said close position, a straight line extending through extending through the second pivot hole and third pivot hole of each said rotational lever and an axis of the respective said second bar are kept in axial alignment and in a parallel relationship with an axis of said driving cylinder.

6. The self-lockable opening and closing mechanism as claimed in claim 1, further comprising at least one adjustment screw rotatably mounted in said top panel of said frame and respectively threaded into one respective said adjustment block in a parallel manner relative to an axis of said driving shaft and rotatable to adjust a distance between one respective said adjustment block and said top panel of said frame.

7. The self-lockable opening and closing mechanism as claimed in claim 6, wherein each said adjustment screw is mounted in said top panel of said frame to keep an axis of said adjustment screw in parallel to the axis of said driving shaft.

8. The self-lockable opening and closing mechanism as claimed in claim 1, further comprising a sliding guide means located at each said side panel and extending in a parallel manner relative to an axis of said driving shaft for guiding sliding movement of one respective said sliding block along one respective said side panel of said frame.

9. The self-lockable opening and closing mechanism as claimed in claim 8, wherein said sliding guide means is a linear guideway.

10. The self-lockable opening and closing mechanism as claimed in claim 1, wherein said vacuum cabin door comprises a door frame and a door panel, said door frame being connected to one side of said base portion of said frame opposite to said driving cylinder, said door frame defining therein a sliding groove in parallel to an axis of said driving shaft and an opening cut through said sliding groove; said at least one valve rod is connected with said door panel and reciprocatable to move said door panel between said close position to seal said opening and said open position to open said opening.

\* \* \* \* \*